US008509300B2

(12) United States Patent
Vromans

(10) Patent No.: US 8,509,300 B2

(45) **Date of Patent: *Aug. 13, 2013**

(54) TRANSMITTER WITH REDUCED POWER CONSUMPTION AND INCREASED LINEARITY

(75) Inventor: Jan S. Vromans, Maastricht (NL)

(73) Assignee: ST-Ericsson SA, Plan-les-Ouates (CH)

( * ) Notice: Subject to any disclaimer, the term of this patent is extended or adjusted under 35 U.S.C. 154(b) by 334 days.

This patent is subject to a terminal disclaimer.

(21) Appl. No.: 12/734,084

(22) PCT Filed: Oct. 7, 2008

(86) PCT No.: PCT/IB2008/054105

§ 371 (c)(1), (2), (4) Date: Sep. 23, 2010

(87) PCT Pub. No.: WO2009/047704

PCT Pub. Date: Apr. 16, 2009

(65) Prior Publication Data

US 2011/0007794 A1 Jan. 13, 2011

(51) Int. Cl.
*H03K 7/08* (2006.01)

(52) U.S. Cl.
USPC .......................................... 375/238; 375/296

(58) Field of Classification Search
USPC .................................................. 375/238, 296
See application file for complete search history.

(56) References Cited

U.S. PATENT DOCUMENTS

| | | | | |
|---|---|---|---|---|
| 6,147,553 | A * | 11/2000 | Kolanek | 330/10 |
| 6,794,931 | B2 * | 9/2004 | Kenington | 330/10 |
| 6,838,931 | B2 * | 1/2005 | Midya et al. | 330/10 |
| 6,993,087 | B2 * | 1/2006 | Rosnell et al. | 375/295 |
| 7,898,352 | B2 * | 3/2011 | Vromans et al. | 332/103 |
| 7,945,224 | B2 * | 5/2011 | Sorrells et al. | 455/127.1 |
| 2003/0112063 | A1 | 6/2003 | Kenington | |
| 2004/0246060 | A1 * | 12/2004 | Varis et al. | 332/109 |
| 2006/0125555 | A1 * | 6/2006 | Watts | 330/10 |
| 2007/0018718 | A1 * | 1/2007 | Horng et al. | 330/10 |
| 2008/0001660 | A1 * | 1/2008 | Rasmussen | 330/10 |

FOREIGN PATENT DOCUMENTS

| | | | |
|---|---|---|---|
| GB | 2 419 757 | A | 5/2006 |
| WO | WO 2007/110831 | A2 | 10/2007 |

OTHER PUBLICATIONS

International Search Report dated Feb. 11, 2009 in connection with PCT Patent Application No. PCT/IB2008/054105.

Written Opinion of the International Searching Authority dated Feb. 11, 2009 in connection with PCT Patent Application No. PCT/IB2008/054105.

* cited by examiner

*Primary Examiner* — Juan A Torres

(74) *Attorney, Agent, or Firm* — Coats & Bennett, P.L.L.C.

(57) ABSTRACT

The application refers to an apparatus comprising, a signal generator (102, 102*a*) configured to generate a signal, a first pulse width modulating unit (106) configured to modulate the signal, an amplifier unit (110) configured to amplify the modulated signal, a feedback loop path (108*a*) configured to correct the modulated signal using an error signal, wherein the apparatus comprises a second pulse width modulating (108) unit configured to modulate the error signal onto the modulated signal.

18 Claims, 12 Drawing Sheets

TRANSMITTER WITH REDUCED POWER CONSUMPTION AND INCREASED LINEARITY

CROSS-REFERENCE TO RELATED APPLICATION(S)

The present application claims priority under 35 U.S.C. §365 to International Patent Application No. PCT/132008/054105 filed Oct. 7, 2008, entitled "TRANSMITTER". International Patent Application No. PCT/IB2008/054105 claims priority under 35 U.S.C. §365 and/or 35 U.S.C. §119(a) to European Patent Application No. 07118138.2 filed Oct. 9, 2007 and which are incorporated herein by reference into the present disclosure as if fully set forth herein.

FIELD OF THE INVENTION

The application relates to an apparatus and method for modulating signals onto a carrier signal and a transmitter. Moreover, the application relates to a computer readable medium having a computer program stored thereon for modulating signals onto a carrier.

BACKGROUND OF THE INVENTION

In communication systems information comprising speech or other data is transmitted via a high frequency signal. For these communication systems communication signals are modulated from the baseband onto a carrier signal via phase modulation, amplitude modulation or other modulation methods within a transmitter.

In general, at first a baseband is generated comprising the information being transmitted. For increasing the transfer rate it is advantageous to use the amplitude component as well as the phase component as information carrier. After modulating the signal onto a carrier signal the signal may be amplified to a adequate transmitting power.

It is very important to reduce power consumption of the used transmitters. In particular, the used power amplifiers, like class A or B amplifiers, dissipate much energy. Thus one method to realize reduction of power consumption is to make use of power amplifiers having a high efficiency, like switching amplifiers. For instance, class D or class E amplifiers can be used.

However, for employing switching amplifiers, suitable modulation methods are necessary since the switching amplifiers make high demands on linearity of the signal being amplified. Due to these high demands it is not possible to directly amplify a modulated signal which does not comprise a constant envelope. Thus appropriate modulation methods are needed, for instance, pulse width modulation (PWM) or pulse density modulation (PDM).

For controlling a switching amplifier, several methods are known. According to one method, the input of the amplifier is driven with a two-level PWM signal, which is generated by comparing the AM- and PM-modulated carrier signal with a triangular or saw tooth signal, which fundamental frequency is at least twice the carrier frequency. This poses the problem of a high switching frequency of the power amplifier and in particular the high linearity requirements regarding the triangular signal. Moreover, the carrier signal already should have been linearly AM-modulated before PWM conversion takes place.

Another possibility for driving a switching amplifier is to use a two-level PWM signal as the amplifier input signal, the PWM signal being generated by a band pass sigma-delta converter. The main disadvantage coming along with this solution is the even higher PA switching frequency, i.e. a significant over-sampling ratio.

According to another class of solutions for controlling a switching power amplifier the amplitude component is added via modulation of the supply voltage of the switching power amplifier. This modulation can be done via an efficient DC-DC converter. However, it is difficult to achieve a high modulation bandwidth and to suppress unwanted noise or ripple generated by the DC-DC converter at the same time.

It is one object of the present application to provide reduced power consumption of the apparatus. It is yet another object of the invention to improve the overall linearity of the apparatus.

SUMMARY OF THE INVENTION

These and other objects are solved by an apparatus comprising a signal generator configured to generate a signal.

Another preferred modulation method is a combined PWM-PPM modulation (PPM: Pulse Position Modulation). However, as switching power amplifiers operate in an strongly non-linear region a linear PWM-PPM modulator will not be sufficient to obtain a distortion free output signal. The apparatus further encompasses a first pulse width modulating unit configured to modulate the signal. The apparatus includes an amplifier unit configured to amplify the signal. The apparatus comprises a feedback loop path configured to correct the signal using a first error signal, wherein the feedback loop path comprises a second pulse width modulating unit configured to modulate the error signal onto the modulated signal.

The apparatus may be implemented within a transmitting device for transmitting any kind of information, like data, speech or the like. Furthermore, the apparatus can be implemented at least partially within a digital domain as well as within an analogue domain.

Moreover, the apparatus encompasses a signal generator. The signal generator may create a signal depending on the information being transmitted. The signal may be a base band signal. The information being transmitted may be contained at least within the amplitude component of the generated signal. The generated signal is then modulated onto a carrier signal by means of the first pulse width modulating unit. The advantage of a pulse width modulated signal is that the modulated signal comprises an almost constant envelope. The modulated carrier signal is then amplified by means of the amplifier unit. A non-linear behaviour of the switches normally results in distortion of the modulated signal. To improve the linearity of the apparatus and the transmitter, which the apparatus according to the invention may be installed in, the apparatus comprises a feedback loop path, in which a first error signal is generated depending on the discrepancy between the wanted and the actual signal outputted by the amplifier. According to the invention the feedback loop path comprises a second pulse width modulating unit configured to modulate the error signal onto the modulated signal.

According to one embodiment, the created signal may be a polar signal. A polar signal comprises generally an amplitude component and a phase component. The transfer rate can be increased due to the fact that both the amplitude component and the phase component can be used as information carriers. The polar signal can be split into an amplitude component and a phase component. The amplitude component is in accordance with the envelope of the polar signal. It is found that merely the amplitude component of the polar signal can be forwarded to the first pulse width modulating unit. The use of the high frequency component of the amplitude may be advantageous. The dynamic range can be improved.

According to a further embodiment, the amplifying unit can be implemented as a switching power amplifying unit within the apparatus for reducing power consumption. A switching amplifying unit may encompass at least one input for the signal being amplified and at least one input for voltage supply. Such a switching unit can be employed in combination with suitable modulation methods, like pulse width modulation (PWM). The switching power amplifier may be a class D or class E amplifier. These types of power amplifiers are especially suitable due to their small power consumption. However, similar amplifying devices can also be implemented into the apparatus according to the application.

The present apparatus according to embodiments may provide a significant power consumption reduction.

According to a further embodiment of the invention the apparatus may comprise a predistortion unit configured to predistort the generated signal. The predistortion unit predistorts the generated signal. In particular, the amplitude component or the envelope can be predistorted. It is found, according to the present invention that the predistortion unit may predict non linear behavior of following employed units. It is further found that the predistortion unit may be used to obtain at least one signal comprising an almost constant envelope. According to the invention the feedback loop path comprises a second pulse width modulating unit by means of which the error signal is modulated onto the modulated signal. Thus, a very high degree of linearity of the overall system is achieved.

It is found that the modulated signal should be substantially linear for applying switching amplifying units. This predistortion unit may thus be configured to determine a phase shift function depending on the generated signal, for example of the amplitude component of a polar signal. For achieving a substantially linear signal, the predistortion unit may convert and bias the amplitude component into a suitable phase shift function containing the signal information, for example the amplitude component information. Furthermore, the predistortion unit may enable in an advantageous manner to calculate a proper phase shift function for further processing, like modulating the phase shift function via pulse width modulation onto a carrier signal.

Moreover, the predistortion unit may comprise a first determining unit to determine a duty cycle function depending on the generated signal, for example, the amplitude component of a polar signal. According to the present application it is found that the desired phase shift function may depend on the duty cycle. The duty cycle depending in turn on the amplitude component may be calculated according to an implemented suitable algorithm. For example, the duty cycle can be calculated by the arcsine function applied to the amplitude and a constant multiplication factor. The found dependency of the duty cycle on the generated signal, in particular the amplitude component of a polar signal, may enable an implementation with low effort and costs.

The predistortion unit may also comprise a second determining unit for determining the desired phase shift function depending on the duty cycle function. It is found that the phase shift function depends linearly on the obtained duty cycle function additionally taking into account the maximum constant phase shift. Thus the needed algorithm can be implemented easily.

The predistortion unit may comprise further units, like limiting units or normalization units. However, a person skilled in the art is able to implement such components if the components are needed.

According to another embodiment, the apparatus may comprise a first pulse position modulating unit configured to process a phase component of the generated signal. It is found that using the phase component as information carrier increases the transfer rate. Pulse position modulating (PPM) may be a suitable modulation form. Such a pulse position unit can be implemented in an easy manner and separated from the pulse width modulating unit. Furthermore, the feedback loop path may comprise a second pulse position modulating unit configured to modulate a second error signal onto the phase component of the modulated signal.

What is more, the first pulse position modulating unit may comprise a first mapping unit configured to map the phase component of the polar signal to at least one suitable function according to a chosen implementation of the pulse position modulating unit. Suitable functions may be trigonometric functions, like sine and/or cosine functions. The input signal of the mapping unit, like the phase component, may be mapped onto at least one of the above mentioned functions. There are several options for mapping, like using a CORDIC algorithm or a ROM table. The use of such options may reduce computing expenditure. The mapping unit may be realized digitally. However, an analogue implementation may be possible as well.

Furthermore, the first pulse position unit may comprise a first up converting unit. This unit may be arranged for modulating the information included in the phase component and the suitable mentioned function, respectively, onto a carrier signal. The carrier signal may be a signal comprising a cosine and/or sine function.

A signal having any suitable frequency can be used as a carrier signal. A voltage control oscillator (VCO), a voltage controlled crystal oscillators (VCXO) or the like may generate the carrier signal.

According to another embodiment of the present invention, the first pulse width modulating unit may comprise a second mapping unit configured to map the phase shift function to at least one suitable function according to a chosen implementation of the first pulse width modulating unit. This second mapping unit can be implemented similar to the first mapping unit.

Additionally, the first pulse width modulating unit may also comprise a second up converting unit which can be realized similar to the first up converting unit. Advantageously, merely one carrier signal generator, like a VCO, may be used for both the pulse width modulating unit and pulse position modulating unit.

An up converting unit may comprise several calculating units to modulate the input signals, like the phase shift function and/or phase component and the corresponding function mentioned above, respectively, onto a carrier signals. For instance, the modulating unit may comprise at least one multiplying unit and/or at least one addition unit and/or at least one signum unit. A comparator can be employed as a signum unit. However, other arrangements comprising other logic and/or calculating units are possible.

The first pulse width modulating unit and the first pulse position modulating unit may be implemented as one pulse width pulse position modulating (PWM-PPM) unit. This unit may comprise merely one mapping unit and one up converting unit. The phase component and the predistorted amplitude component both may be fed to the pulse width pulse position modulating unit. A realization of the pulse width pulse position modulating unit can be performed with small effort and reduced costs.

Furthermore the second pulse width modulating unit and the second pulse position modulating unit may be arranged as one pulse width pulse position modulating unit.

According to another embodiment, the feedback loop path may encompass a down converting and error detecting unit. This unit may be realized entirely analogue. Several components may be arranged within this unit, like integrator, low pass filter, delay element, comparing unit, multiplier and the like. The a down converting and error detecting unit may be configured to convert the measured combined signal down and to detect an error, like an phase and/or amplitude error, subsequently. This unit may also be realized entirely analogue.

Another aspect of the present application is a method comprising generating a signal. The method includes modulating the signal using pulse width modulation. The method comprises amplifying the modulated signal. The method further comprises the step of generating an error signal in a feedback loop path and modulating the error signal onto the modulated signal using pulse width modulation.

A further aspect of the present application is a computer readable medium having a computer program stored thereon. The computer program comprises instructions operable to cause a processor to perform at least the above mentioned method.

The present application can be deployed in several application areas which include efficient modulated transmitters. The transmitters can be used for WLAN, WPAN, Bluetooth, OFDM, GSM, UMTS, CDMA, low power mobile communication devices and the like.

It should be denoted that only elements relevant to the principle of the present application are explained above. Components, like delay elements or analog digital converter are omitted. However, a person skilled in the art is able to implement such components if the components are needed.

These and other aspects of the present patent application become apparent from and will be elucidated with reference to the following figures. The features of the present application and of its exemplary embodiments as presented above are understood to be disclosed also in all possible combinations with each other.

DETAILED DESCRIPTION OF THE DRAWINGS

In the following detailed description of the present invention exemplary embodiments of the present invention will describe and point out the architecture of the apparatus according to the invention. The main advantage of the invention and thus of all embodiments is a reduced power consumption and an increased linearity of the signal being amplified.

Figure 1:
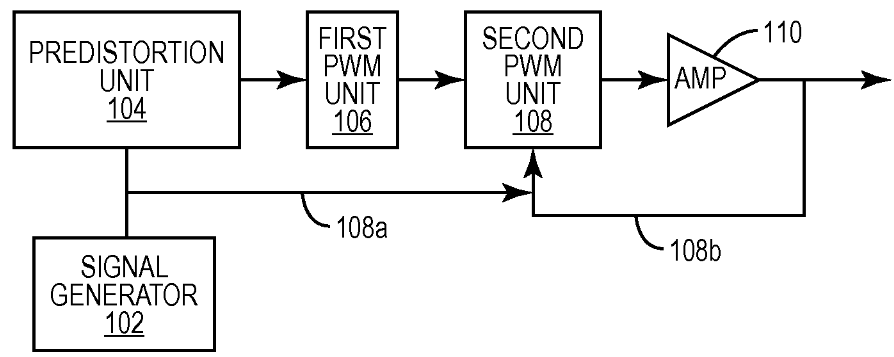
FIG. 1 a first embodiment of the apparatus according to the invention.

FIG. 1 shows an exemplary simplified embodiment of the apparatus according to the present invention. The shown apparatus can generally be implemented in an analogue way or partly within the digital and partly within the analogue domain.

According to this embodiment the apparatus comprises a signal generator 102. Presently, the signal generator 102 is connected to a predistortion unit 104, which is optional and increases overall linearity of the apparatus. Both units 102, 104 may be implemented within the digital domain. For instance, the signal generator 102 may be a digital base band processor which generates at least one signal. The signal, for example an amplitude component including the information being transmitted of the generated signal, may be forwarded to the predistortion unit 104.

The predistortion unit 104 may comprise suitable components to realize the essential algorithms for predistortion. An elucidation of one embodiment of the predistortion unit 104 according to the present application occurs subsequently.

The signal created by the predistortion unit 104 is fed to a first pulse width modulating unit 106 which will be described in more detail subsequently. In general, the modulating unit 106 may modulate the incoming signal onto a carrier signal. The first pulse width modulating unit 106 may be realized partly analogue and partly digitally.

In turn, the first pulse width modulating unit 106 is connected to a second pulse width modulating unit 108, which modulates an error signal onto the modulated signal as explained below. The modulated signal thus corrected is fed to an amplifier unit 110. The amplifier unit 110 may be a switching power amplifier, like class D or class E amplifiers. These types of amplifiers offer the advantage to be very efficient. However, according to other variants of the present application, employing of different amplifiers is possible.

The amplified signal may then be filtered in a filtering unit (not shown). The amplified and optionally filtered signal may then be fed to an antenna device (not shown) for transmission.

According to the invention the signal is also fed to the second pulse width modulating unit 108 via a feedback loop path 108*a* configured to correct the signal using an error signal. The feedback loop path may thus comprise a down converting and error detecting unit (not shown in FIG. 1), which receives a reference signal from the signal generator 102 via a reference signal path 108*b*. The feedback loop path 108*a* ensures a high degree of linearity of the apparatus despite the fact that a switching Power amplifier, which may be used in the apparatus due to their high efficiency, operates in a strongly non-linear region.

A transmitter should offer a good linearity for the case a switching power amplifier, like a class D or E amplifier, is used for reducing power consumption. Pulse width modulated signals are suitable to obtain a good linearity.

Figure 2:
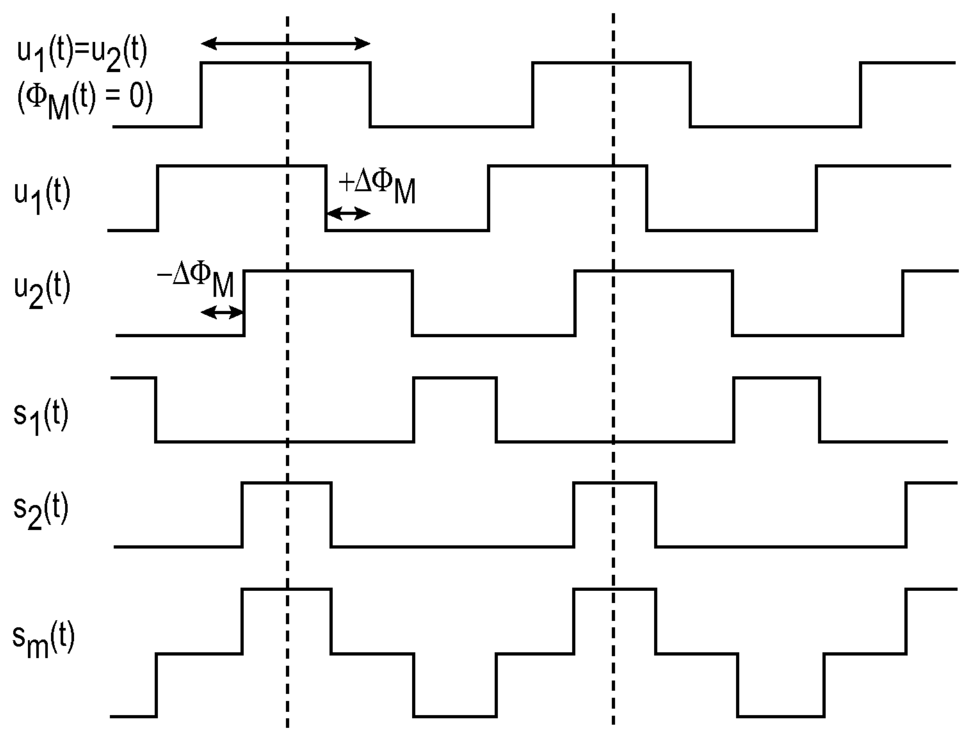
FIG. 2 a first exemplary diagram to create a pulse width modulated signal.

There are several methods to generate a pulse width modulated signal (PWM signal), like applying a saw or triangular signal. A PWM signal can be done with the help of two opposite shifted carriers. FIG. 2 shows signals $u_1(t)$ and $u_2(t)$ which are opposite phase shifted by $\Delta\Phi_M$.

The phase shift signal or function $\Phi_M(t)$ includes the information of the amplitude component A being transmitted. For simplification reasons only a constant phase shift $\Delta\Phi_M$ is shown according to FIGS. 2 and 3. It will be explained subsequently how the phase shift signal $\Phi_M(t)$ can be obtained.

The illustrated signal $s_1(t)$ can be obtained using a NOR function of the opposite phase shifted signals $u_1(t)$ and $u_2(t)$. The second signal $s_2(t)$ can be determined by an AND function of the signals $u_1(t)$ and $u_2(t)$. A detailed implementation of the apparatus will be elucidated subsequently.

Figure 3:
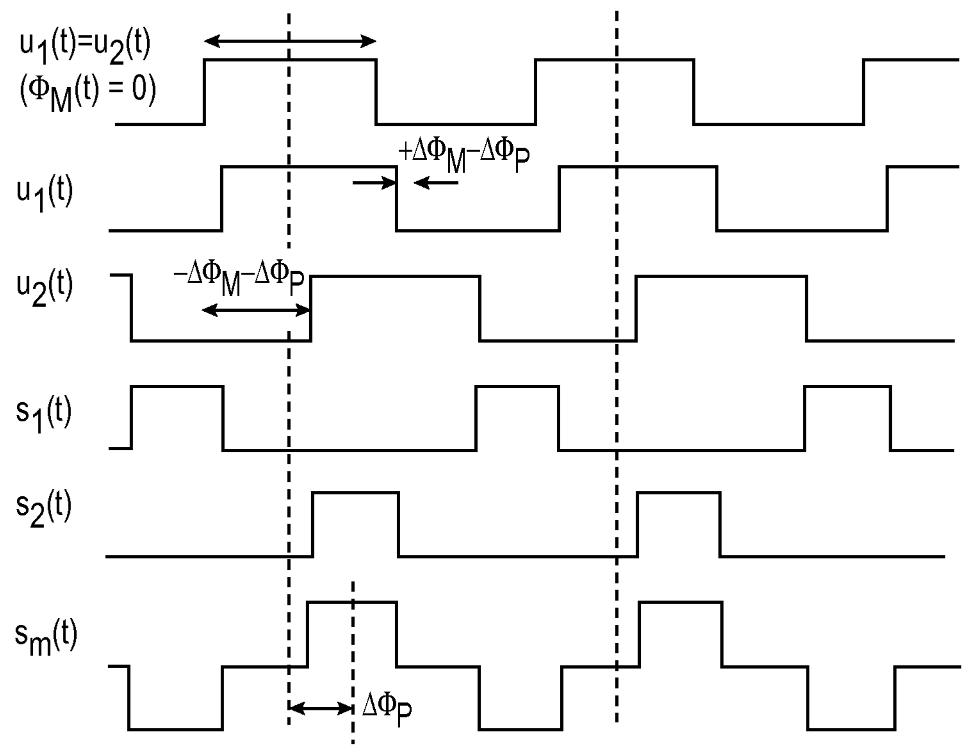
FIG. 3 a second exemplary diagram to create a pulse width modulated signal having an additional phase shift depending on the pulse position modulation.

FIG. 3 shows similar signals compared to FIG. 2. The difference between the two diagrams according to FIGS. 2 and 3 is an additional phase shift $\Delta\phi_p$ depending on a PPM modulation of the phase component $\phi_p$ of the generated signal.

In the following a possible predistortion for deriving the desired phase shift function $\Phi_M(t)$ to achieve an almost linear signal for driving the amplifying unit 110 is explained. By the aid of the following FIG. 4, it will be elucidated how the desired phase shift function $\Phi_M(t)$ which represents the amplitude information is determined.

Figure 4:
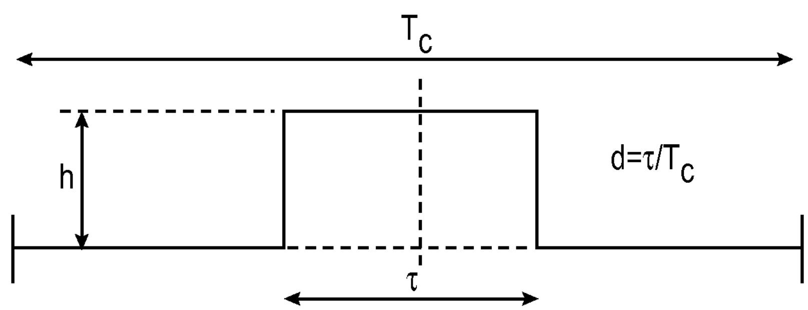
FIG. 4 an exemplary diagram of a pulse.

In FIG. 4 an exemplary diagram of a pulse is shown. The depicted pulse has a pulse length $\tau$ and a height h within a period $T_C$ corresponding to the carrier frequency $\omega_X$.

Thus the duty cycle is $d=\tau/T_c$. Through Fourier series expansion the following equitation can be obtained $$f(t) = \frac{\tau h}{T_C} + \frac{2h}{\pi}\left[\sin\left(\frac{\tau}{T_C}\pi\right)\cos(\omega_C t) + \frac{1}{2}\sin\left(\frac{2\tau}{T_C}\pi\right)\cos(2\omega_C t) + \frac{1}{3}\sin\left(\frac{3\tau}{T_C}\pi\right)\cos(3\omega_C t) + \dots\right]$$

Substitution of the duty cycle d and conversion of the function f(t) into a sum yield $$f(t) = dh + \frac{2h}{\pi}\sum_{n=1}^{\infty}\frac{\sin(nd\pi)}{n}\cos(n\omega_C t).$$

This function represents the relation between the amplitudes of the fundamental frequency and its harmonics depending on the duty cycle d. The amplitude $A_n$ of the $n^{th}$ harmonic of the fundamental frequency as a function of the duty cycle is then given by $$A_n = \frac{2h}{\pi}\frac{\sin(nd\pi)}{n}.$$

$A_n$ reaches its maximum value $$A_{n,max} = \frac{2h}{\pi n}$$

for a duty cycle value $$d = \frac{1}{2n}.$$

According to the present invention it has been found that for the applied PWM modulation method a continuously decreasing or increasing function $A_n$ (d) is needed. The range of the duty cycle d and thus the range of the amplitude $A_1$ representing the amplitude of the first harmonic are $$d \Rightarrow 0 \dots 0.5 \text{ and } A_1 \Rightarrow 0 \dots 2/\pi$$

Function $A_1$ is a continuously increasing or decreasing function. It is further found, according to the present invention that an amplitude change of the $n^{th}$ harmonic of the pulse train may occur according to the next equitation $$d = \frac{1}{n\pi}\arcsin\left(\frac{n\pi A_n}{2h}\right).$$

The duty cycle d of the first harmonic signal is achieved by substitution of n=1 and h=1

$$d = \frac{1}{\pi}\arcsin\left(\frac{\pi A_1}{2}\right).$$

An envelope signal which may be normalized in the range from 0 to 2π will result in a linear AM modulation of the first harmonic fundamental of the pulse width modulated signal. It may be suitable to normalize the amplitude $A_{norm}$ to the range from 0 to 1 and the final predistortion function is then:

$$d(t) = \frac{1}{\pi}\arcsin(A_{norm}(t)).$$

Thus a duty cycle function d(t) is obtained in the predistortion unit 104.

As may be seen from FIG. 2 the maximum phase shift is given by $$\hat{\Phi}_M = \frac{\pi}{2}.$$

The desired phase shift function $\Phi_M(t)$ can also be derived from FIG. 2. Depending on the duty cycle d(t) and the maximum phase shift $\hat{\Phi}_M$ the searched function $\Phi_M(t)$ is given by $$\Phi_M(t) = (1-2d(t))\hat{\Phi}_M.$$

This function $\Phi_M(t)$ which comprises the amplitude information being transmitted is suitable for the applied PWM modulation.

For an additional PPM modulation predistortion and conversion is not needed due to the linear relation between the wanted phase modulation $\Phi_P(t)$ and the phase component. Thus $\Phi_P(t)$ is given by the following equitation $$\Phi_P(t) = \arg(s_{baseband}(t)).$$

Figure 5:
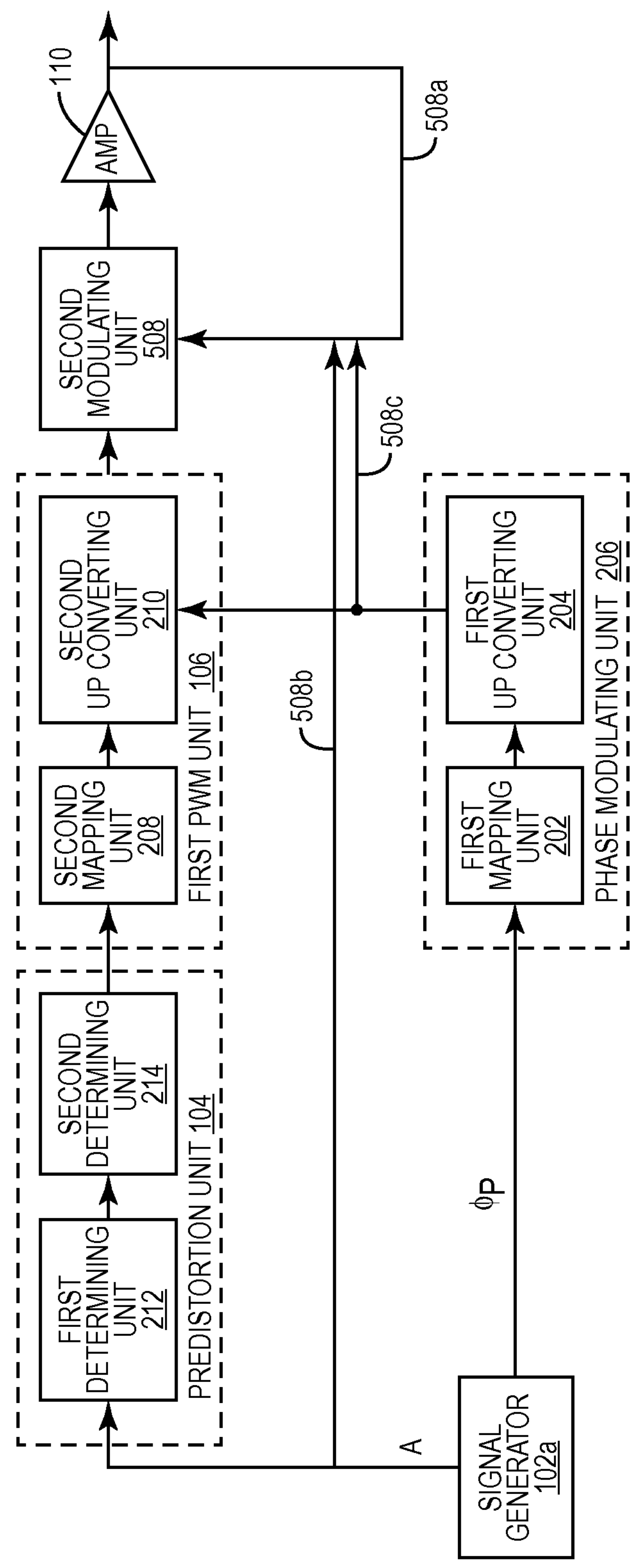
FIG. 5 a second embodiment of the apparatus according to the present invention FIG. 6 an implementation of an PWM-PPM modulator according to the invention.

FIG. 5 shows a further exemplary simplified embodiment of the apparatus according to the present invention. The shown apparatus can be implemented in an analogue way or partly within the digital and partly within the analogue domain. The already known components are not explained again and hold the same reference signs.

The apparatus encompasses a signal generator 102*a*. The signal generator 102*a* depicted in this embodiment generates a base band polar signal. However, use of other signals is possible. This polar signal comprises an amplitude component A and a phase component $\Phi_P$. Both are used as information carriers according to the present embodiment. The phase component $\Phi_p$ is fed to a phase modulating unit 206.

In detail, the phase component $\Phi_p$ is forwarded to a first mapping unit 202 included by the phase modulating unit 206. This mapping unit 202 may be configured to map the input variables to proper functions for following modulating operations. The CORDIC algorithm, a ROM table or other appropriate methods can be implemented for mapping to reduce calculating time.

The signal created by mapping unit 202 is forwarded to a first up converting unit 204 where pulse position modulation (PPM) is performed. The up converting unit 204 may be implemented analogue and may comprise at least one carrier signal generator, like a voltage control oscillator (VCO), a voltage controlled crystal oscillators (VCXO) or the like. In addition, multipliers may be arranged within the up converting unit 204 for up converting.

The amplitude component A is forwarded to the arranged predistortion unit 104. The predistortion unit 104 comprises at least a first determining unit 212 and a second determining unit 214 according to the present embodiment.

In the first determining unit 212 the duty cycle function d may be calculated depending on the amplitude component A according to the function $$d = \frac{1}{\pi}\arcsin(A).$$

The achieved duty cycle d can be forwarded to the second determining unit 214 to calculate the desired phase shift function $\Phi_M(t)$ by the given function $$\Phi_M = (1-2d)\hat{\Phi}_M,\ \text{wherein}\ \hat{\Phi}_M = \frac{\pi}{2}.$$

The determined phase shift function $\Phi_M(t)$ is fed to the first pulse width modulating unit 106 which comprises at least a second mapping unit 208 and a second up converting unit 210.

The depicted second mapping unit 208 may operate similar to the previous mentioned first mapping unit 202. The achieved suitable functions comprising the information being transmitted are forwarded to the second up converting unit 210, where pulse width modulation (PWM) is performed. This up converting unit 210 can also be supplied by the at least one carrier signal comprising the information of the phase component $\Phi_p$. An additional carrier signal generator may be omitted, since the carrier signal generator of the first up converting unit 204 can be used easy implementation is possible. By means of multipliers or the like, a modulated signal can be created which comprises both the amplitude and phase information.

The two arranged modulating units 106, 206 can be implemented as a common unit, like a pulse width pulse position modulating unit (PWM-PPM) according to other embodiments of the present application.

The signal outputted by the first modulating unit 106 is fed to a second modulating unit 508 and eventually to the amplifier unit 110. According to the invention the architecture according to FIG. 5 comprises a feedback loop path 508*a* configured to correct the modulated signal using an error signal. The feedback loop path may thus comprise a down converting and error detecting unit (not shown in FIG. 5), which receives an amplitude reference signal via reference signal path 508*b* and a phase reference signal via reference path 508*c*. Presently, second modulating unit 508 is a common modulating unit comprising the second PWM unit and the second PPM unit.

Further processing is already known and will be elucidated in more detail subsequently.

Figure 6:
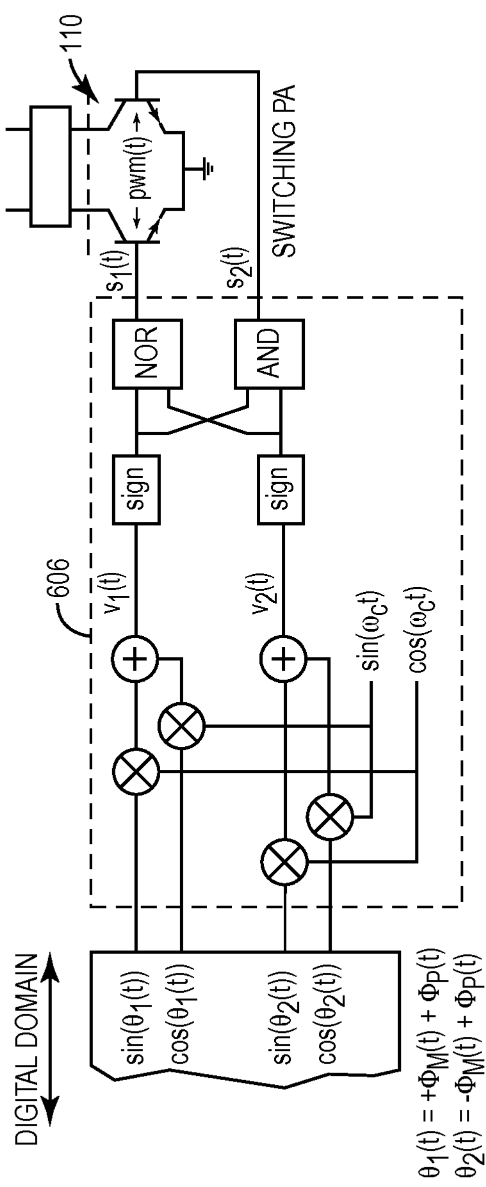

In FIG. 6 an implementation of a PWM-PPM modulator according to the invention is shown. The modulating unit 606 contains the first up converting unit 204 and the second up converting unit 210. Depicted are only the four functions provided by a mapping unit comprising the first mapping unit 202 and the second mapping unit 208.

$$\sin(\Theta_1(t)),\ \cos(\Theta_1(t)),\ \sin(\Theta_2(t)),\ \cos(\Theta_2(t))\ \text{wherein:}$$

$$\Theta_1(t)=\Phi_P(t)+\Phi_M(t)\ \text{and}\ \Theta_2(t)=\Phi_P(t)-\Phi_M(t).$$

These four trigonometric functions can be created within a digital domain whereas further processing can be performed in an analogue domain. The four trigonometric functions are fed to the modulating unit 606. According to the present embodiment the modulating unit 606 comprises four multiplying units and two addition units. At the two outputs of the modulating unit 606 the signals $$v_1(t)=\sin(\omega_C t+\Phi_P(t)+\Phi_M(t))\ \text{and}\ v_2(t)=\sin(\omega_C t+\Phi_P(t)-\Phi_M(t)).$$

are obtained.

Following the signal path two signum units are arranged yielding the opposite phase shifted signals $$u_1(t)=\text{sign}(\sin(\omega_C t+\Phi_P(t)+\Phi_M(t)))\ \text{and}\ u_2(t)=\text{sign}(\sin(\omega_C t+\Phi_P(t)-\Phi_M(t))).$$

The signals $u_1(t)$ and $u_2(t)$ are then crosswise fed to a NOR and an AND gate yielding the signals $s_1(t)$ and $s_2(t)$:

$$s_1(t)=u_1(t)\overline{\cup}u_2(t)\ \text{and}\ s_2(t)=u_1(t)\cap u_2(t).$$

These signals are then fed to the amplifier unit 110, e.g. a switching power amplifier, as shown in FIG. 6. In general, $s_1(t)$ and $s_2(t)$ can be used as a phase modulated signal which is useful for non-balanced power amplifier configurations.

Different implementations comprising other calculating and logical units are possible. For lucidity reasons the needed at least one carrier signal generator, for instance a voltage control oscillator (VCO), is also not shown in FIG. 6. Illustrated are only two input signals $\sin(\omega_C t)$ and $\cos(\omega_C t)$ corresponding to the carrier frequency $\omega_C$.

Figure 7:
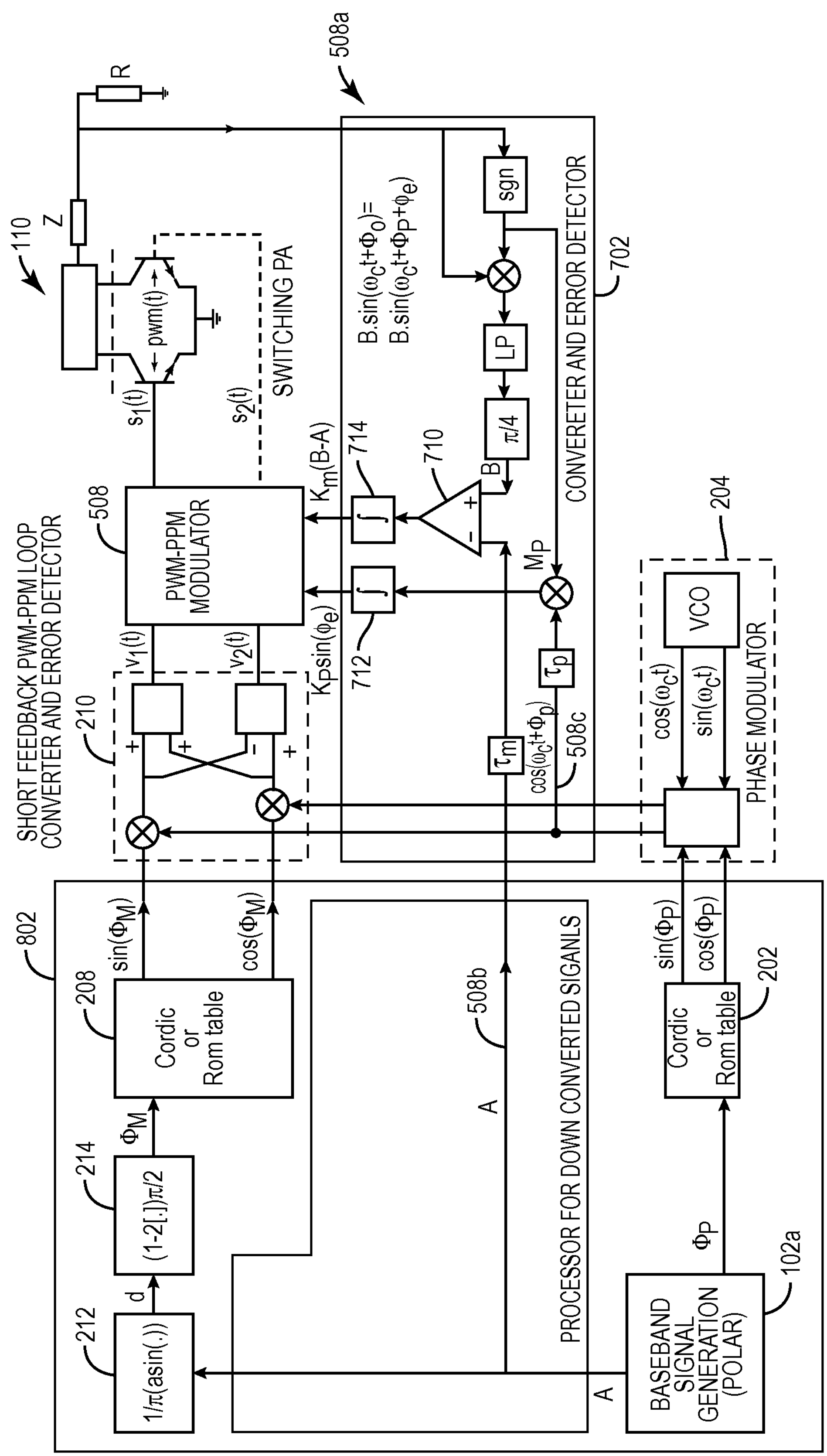
FIG. 7 a third embodiment of the apparatus according to the application.

FIG. 7 shows a third embodiment of the apparatus comprising a feedback loop path 508*a* according to the present invention. This feedback loop path 508*a* is only implemented within the analogue domain.

The shown apparatus comprises already known units holding the same reference signs, like determining units 212, 214, mapping units 202, 208, up converting units 204, 210 and the like. The shown apparatus includes second PWM-PPM modulating unit 508 and a down converting and error detecting unit 702.

In turn, the down converting and error detecting unit 702 comprises several components, like two integrators 712, 714, a low pass filter LP, two delay elements $\tau_p$, $\tau_m$, a comparing unit 710, two RF-multipliers, a sgn operator and a constant multiplication factor $\pi/4$.

The functioning of the apparatus shown in FIG. 7 is described in the following:

The measured signal $B_{meas}(t)$ can be written in more detail as $$B_{meas}(t)=B(t)\sin(\omega_c t+\Phi_o)=B(t)\sin(\omega_c t+\Phi_P+\Phi_e).$$

At first, the amplitude path is explained. For obtaining amplitude B(t), the measured signal $B_{meas}(t)$ can be processed as follows $$B(t)\sin(\omega_c t+\Phi_o+\Phi_e)\times\mathrm{sign}(B(t)\sin(\omega_c t+\Phi_o+\Phi_e))$$

by the arranged multiplier and sgn operator. After low pass filtering and scaling the desired amplitude B(t) can be obtained. This amplitude B(t) can be compared with the delayed desired amplitude $A(t-\tau_m)$ by the comparing unit 710. For example, a comparator can be used. The resulting signal can be integrated by integrator 714 resulting in signal $$\mathrm{INT3}(t)=K_m(B(t)-A(t-\tau_m)),$$

wherein $K_m$ is a constant gain factor.

This signal INT3(*t*) can be fed to the second modulating unit 508, which is a PWM-PPM modulator, for correcting the phase shift function $\Phi_M(t)$.

For correcting the phase component $\Phi_p$, the real sliced RF carrier can be multiplied with the desired complex phase modulated RF carrier. The resulted output signal can be forwarded to integrator 712, wherein the following signal can be achieved $$\mathrm{INT1}_1(t)=K_p\sin(\Phi_e),$$

wherein $K_p$ is a constant gain factor. Signal INT1(*t*) can also be used for correcting signals $v_1(t)$ and $v_2(t)$.

Figure 8:
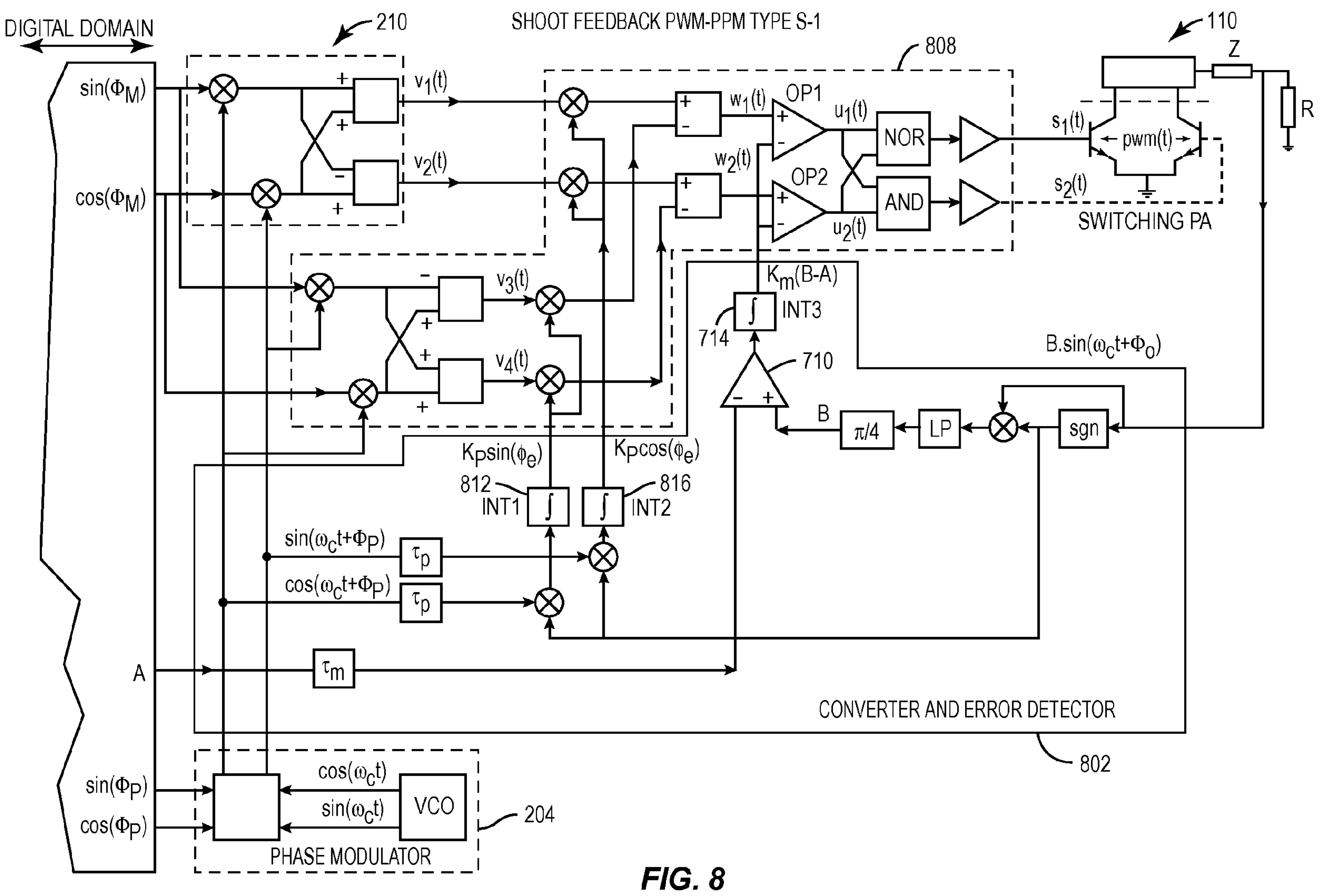
FIG. 8 a fourth embodiment of the apparatus according to the invention.

FIG. 8 shows a fourth embodiment of the apparatus according to the invention. The digital domain yielding the functions $\sin(\Phi_M)$, $\cos(\Phi_M)$, $\sin(\Phi_P)$, $\cos(\Phi_P)$ is similar to that of the previous FIG. 7 and not shown in detail for clarity reasons.

The apparatus according to FIG. 8 comprises a first up converting unit 204 and a second up converting unit 210 as described above. Furthermore the apparatus comprises a second modulating unit 808 (PWM-PPM modulating unit) and a down converting and error detecting unit 802.

The second modulating unit 808 for its part comprises six multiplying units, four addition units and two comparators OP1, OP2. Furthermore, the second modulating unit 808 comprises a NOR and an AND gate yielding the $s_1(t)$ and $s_2(t)$ signals fed to the amplifier unit 110 as explained above. In turn, the down converting and error detecting unit 802 comprises several components, like two delay elements $\tau_p$, two RF-multipliers and two integrators 812, 816 for phase correction, one sgn operator, one RF-multiplier as well as one low pass filter LP, one constant multiplication factor $\pi/4$, one delay elements $\tau_m$, a comparing unit 710 and an integrator 714 for amplitude correction.

To apply the additional PWM-PWM modulation through second modulating unit 808 the standard signals $v_1(t)$ and $v_2(t)$ are extended with the signals $v_3(t)$ and $v_4(t)$ having a respective 90° phase shift with respect to the signals $v_1(t)$ and $v_2(t)$:

$$v_3(t)=\cos(\omega_c t+\Phi_P(t))\cos(\Phi_M(t))-\sin(\omega_c t+\Phi_P(t))\sin(\Phi_M(t))=\cos(\omega_C t+\Phi_P(t)+\Phi_M(t))$$

$$v_4(t)=\sin(\omega_c t+\Phi_P(t))\sin(\Phi_M(t))+\cos(\omega_c t+\Phi_P(t))\cos(\Phi_M(t))=\cos(\omega_C t+\Phi_P(t)-\Phi_M(t))$$

Multiplication and adequate combining of the signals $v_1(t)$, $v_2(t)$, $v_3(t)$ and $v_4(t)$ with the signal which represents the phase error result in the signals with $w_1(t)$ and $w_2(t)$ given by:

$$w_1(t)=K_P v_1(t)\cos(\phi_e(t))-K_P v_3(t)\sin(\phi_e(t))=K_P\sin(\omega_C t+\Phi_P(t)+\Phi_M(t)-\phi_e(t)),$$

$$w_2(t)=K_P v_2(t)\cos(\phi_e(t))-K_P v_4(t)\sin(\phi_e(t))=K_P\sin(\omega_C t+\Phi_P(t)-\Phi_M(t)-\phi_e(t)))$$

The phase error between the desired phase modulation and the actual phase modulation is defined as:

$$\phi_e(t)=\Phi_0(t)-\Phi_P(t)$$

The desired signals will be obtained for $\phi_e(t)=0$.

An increase of the output phase with respected to the desired phase ($\Phi_0>\Phi_P$) will result in an increase of the phase error $\phi_e(t)$ which will result next in a decrease of the output phase.

For zero output signal of the integrator INT3 the signals with $w_1(t)$ and $w_2(t)$ will result into two symmetrical sliced signals at the output of the comparators OP1 and OP2. Combining the comparator output signals in a NOR and AND gate will then result into the two PWM-PPM modulated signals .$s_1(t)$ and $s_2(t)$ given by:

$$s_1(t)=f\left(t-\frac{T_C}{4}\right)=dh+\frac{2h}{\pi}\sum_{n=1}^{\infty}\frac{\sin(nd\pi)}{n}\cos\left(n\omega_C t-n\frac{\pi}{2}\right)$$

$$s_2(t)=f\left(t-\frac{3T_C}{4}\right)=dh+\frac{2h}{\pi}\sum_{n=1}^{\infty}\frac{\sin(nd\pi)}{n}\cos\left(n\omega_C t-n\frac{3\pi}{2}\right)$$

The first harmonic between the difference of $s_1(t)$ and $s_2(t)$ is:

$$s_1(t)-s_2(t)=f\left(t-\frac{3T_C}{4}\right)=\frac{2h}{\pi}\sin(d\pi)\left(\cos\left(\omega_C t-\frac{\pi}{2}\right)-\cos\left(\omega_C t-\frac{3\pi}{2}\right)\right)=\frac{4h}{\pi}\sin(d\pi)\sin(\omega_C t)$$

In case of phase modulation and no phase error this becomes:

$$s_1(t)-s_2(t)=\frac{4h}{\pi}\sin(d\pi)\sin(\omega_C t+\Phi_P)$$

The duty cycle of these PWM-PPM modulated signal is completely determined by the phase modulation $\Phi_M(t)$.

When the actual level of the fundamental of the output RF carrier does not correspond to the desired level an error signal will be generated which controls the slicing level of the comparators OP1 en OP2 resulting in an adaptation of the pulse width.

The actual signal level of the RF carrier is measured according the following equation:

$$\mathrm{INT3}(t)=K_m(B(t)-A(t-\tau_m)),$$

resulting in a control signal at the output of INT3

$$\mathrm{INT3}(t)=K_m\cdot(B(t)-A(t)):$$

The constant $K_m$ is a gain factor and not essential for the principle of operation.

To correct phase errors it must be distinguished between the desired phase and the unwanted phase. For this reason there is a need of the phase modulated RF carrier which causes a large influence on the architecture of the transmitter. The signal error generation to correct the phase is explained below. The real sliced RF carrier (already used for pulse width control) is multiplied with the desired complex phase modulated RF carrier. The two output signals of these multiplications are fed to the two integrators INT1 and INT2. The output signal of the integrators can be written as:

$$INT1(t)=\sin(\phi_e(t))=\sin(\Phi_0(t)-\Phi_P(t))$$

$$INT2(t)=\cos(\phi_e(t))=\cos(\Phi_0(t)-\Phi_P(t))$$

Multiplication of the output signals of the integrators INT1 and INT2 with the signals $v_1$, $v_2$, $v_3$ and $v_4$ and adequate combining of the multiplicated signals results into the signals $w_1(t)$ and $w_2(t)$.

Figure 9:
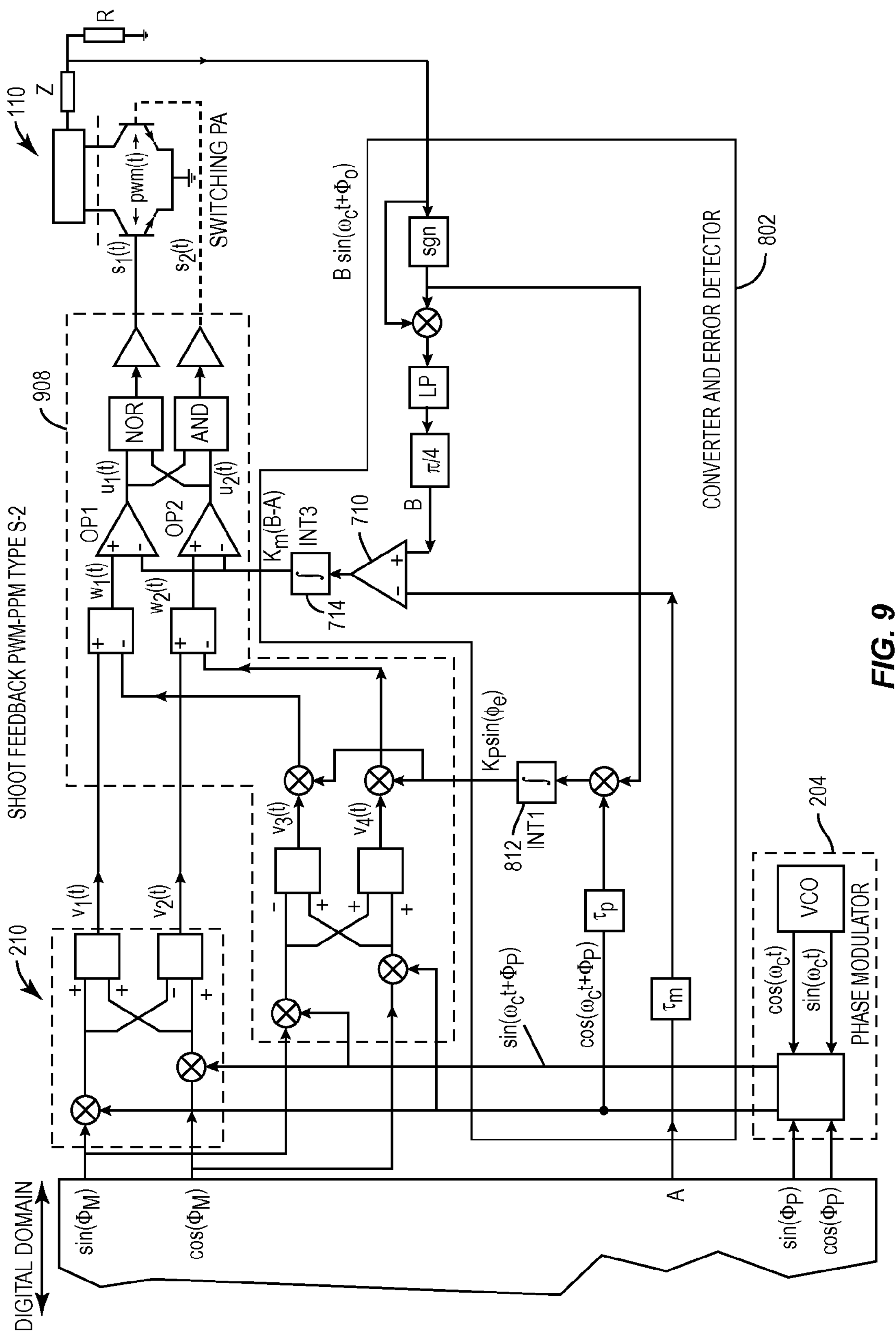
FIG. 9 a fifth embodiment of the apparatus according to the application.

In FIG. 9 a fifth embodiment of the apparatus according to the invention is shown. The apparatus again comprises a second modulating unit 908 (PWM-PPM-modulator) and a down converting and error detecting unit 902. Down converting and error detecting unit 902 features an simplified phase control path comprising only one delay element $\tau_p$, one RF-multiplier and one integrator 812 for phase correction. Correspondingly, the second modulating unit 908 merely comprises four multiplying units, and again four addition units and two comparators OP1, OP2. Furthermore, the second modulating unit 908 comprises a NOR and an AND gate yielding the $s_1(t)$ and $s_2(t)$ signals fed to the amplifier unit 110 as explained above.

In the apparatus according to FIG. 9 the phase shift is now obtained by adding an equal weighted 90° shifted carrier to the signals $v_1(t)$ and $v_2(t)$, which results in the following phase shifted signals $w_1(t)$ and $w_2(t)$:

$$w_1(t)=v_1(t)-K_P\sin(\phi_e(t))v_3(t),$$

$$w_2(t)=v_2(t)-K_P\sin(\phi_e(t))v_4(t),$$

Further processing of the signals $w_1(t)$ and $w_2(t)$ is performed as explained in the description of FIG. 8.

Figure 10:
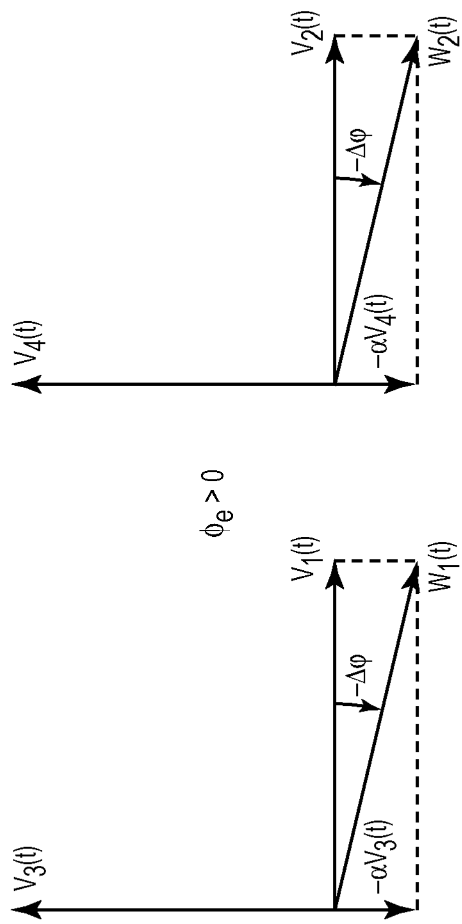
FIG. 10 an exemplary diagram of a phase correction in the embodiment according to FIG. 9.

FIG. 10 shows the negative phase correction on the signals $w_1(t)$ and $w_2(t)$ for a positive phase error $\phi_e=\Phi_0-\Phi_P>0$), which is correct. $K_P$ is a gain factor and is not essential for the principle.

Figure 11:
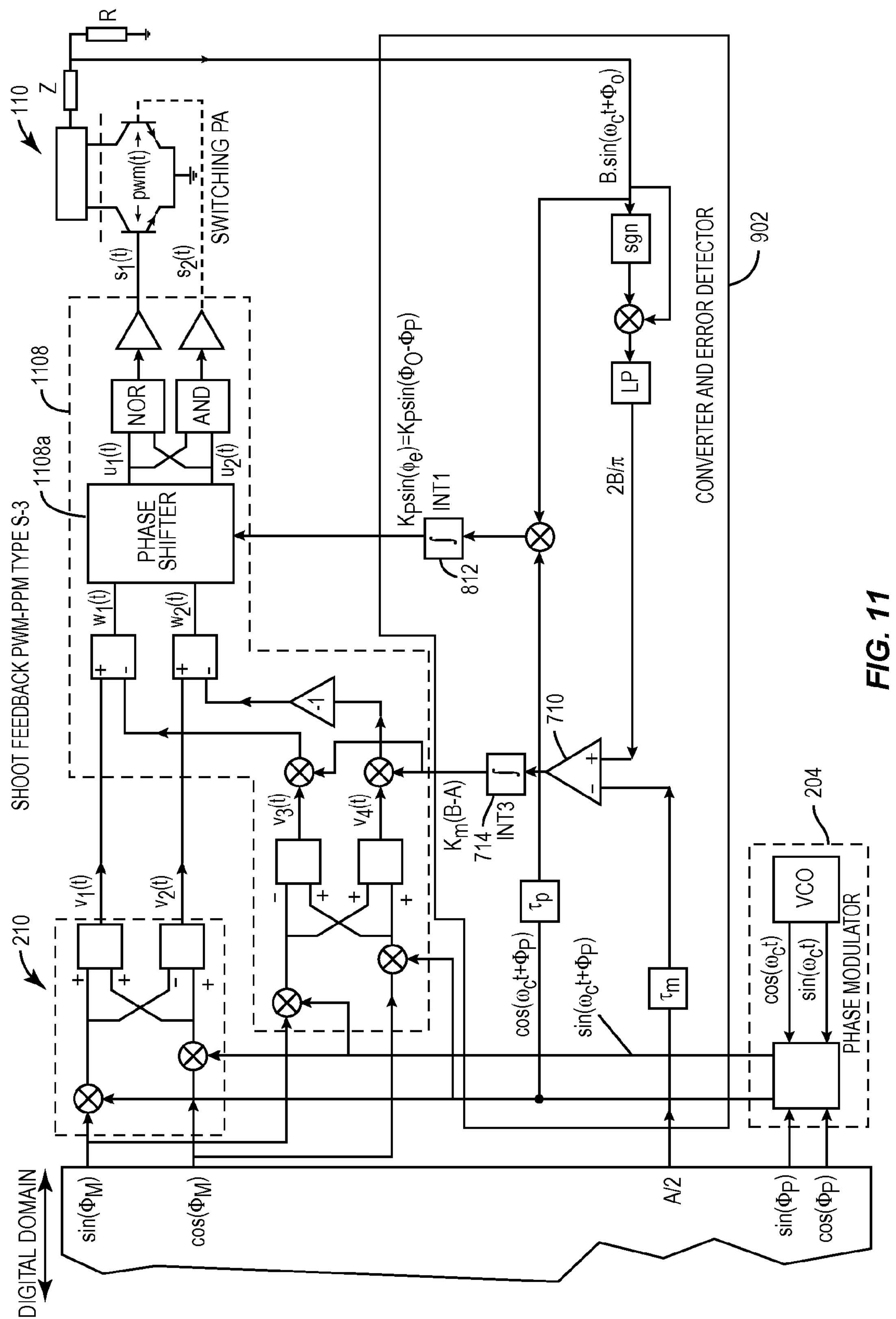
FIG. 11 a sixth embodiment of the apparatus according to the application.

In FIG. 11 a sixth embodiment of the apparatus according to the invention is shown. The apparatus again comprises the down converting and error detecting unit 902 as described above and a second modulating unit 1108 (PWM-PPM-modulator). Second modulating unit 1108 comprises four multiplying units, four addition units, an inverting unit and a phase shifting unit 1108*a*. The phase shifting unit 1108*a* may comprise a filter by means of which the phase may be varied by controlling a resistor or varicap. It is preferable to choose an allpass filter with a varying delay, because this gives less problems for the comparators since the RF sinewave carrier does not change in amplitude.

Another way to control the phase of $w_1(t)$ and $w_2(t)$ is to make use of comparators from which the hysteresis can be controlled. The hysteresis and the variation of the hysteresis on the leading and the trailing edge have to be the same, which is difficult to achieve with practical RF circuits.

The phase shifting unit 1108*a* outputs the signals $u_1(t)$ and $u_2(t)$ which are crosswise fed to a NOR and an AND gate yielding the $s_1(t)$ and $s_2(t)$ signals which are in turn fed to the amplifier unit 110 as explained above.

The apparatus according to FIG. 11 differs from the apparatus of the previous FIG. 10 in that the pulse phase and pulse width feedback positions are interchanged. In the second modulating unit 1108 pulse width control is obtained by an equal positive and negative phase shift of the signals $v_1(t)$ and $v_2(t)$. This is obtained by adding successively subtracting equal weighted values of the signals $v_3(t)$ and $v_4(t)$ to the signals $v_1(t)$ and $v_2(t)$:

$$w_1(t)=v_1(t)+K_m(B(t)-A(t-\tau_m))v_3(t),$$

$$w_2(t)=v_2(t)-K_m(B(t)-A(t-\tau_m))v_4(t)$$

Figure 12:
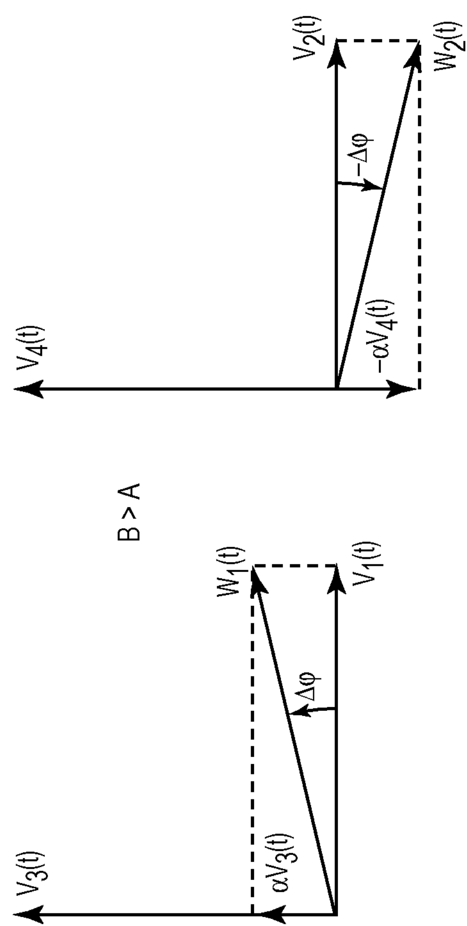
FIG. 12 an exemplary phase correction diagram relating to the embodiment according to FIG. 11.

FIG. 12 shows the phase correction on the signals $w_1(t)$ and $w_2(t)$ for an envelope signal which is larger as desired. Because of the fact that (B−A)>0, an increase of the absolute value of $\Phi_M$ is obtained which results in a smaller duty cycle. The smaller duty cycle will finally result in a smaller RF carrier (envelope) which is correct.

Figure 13:
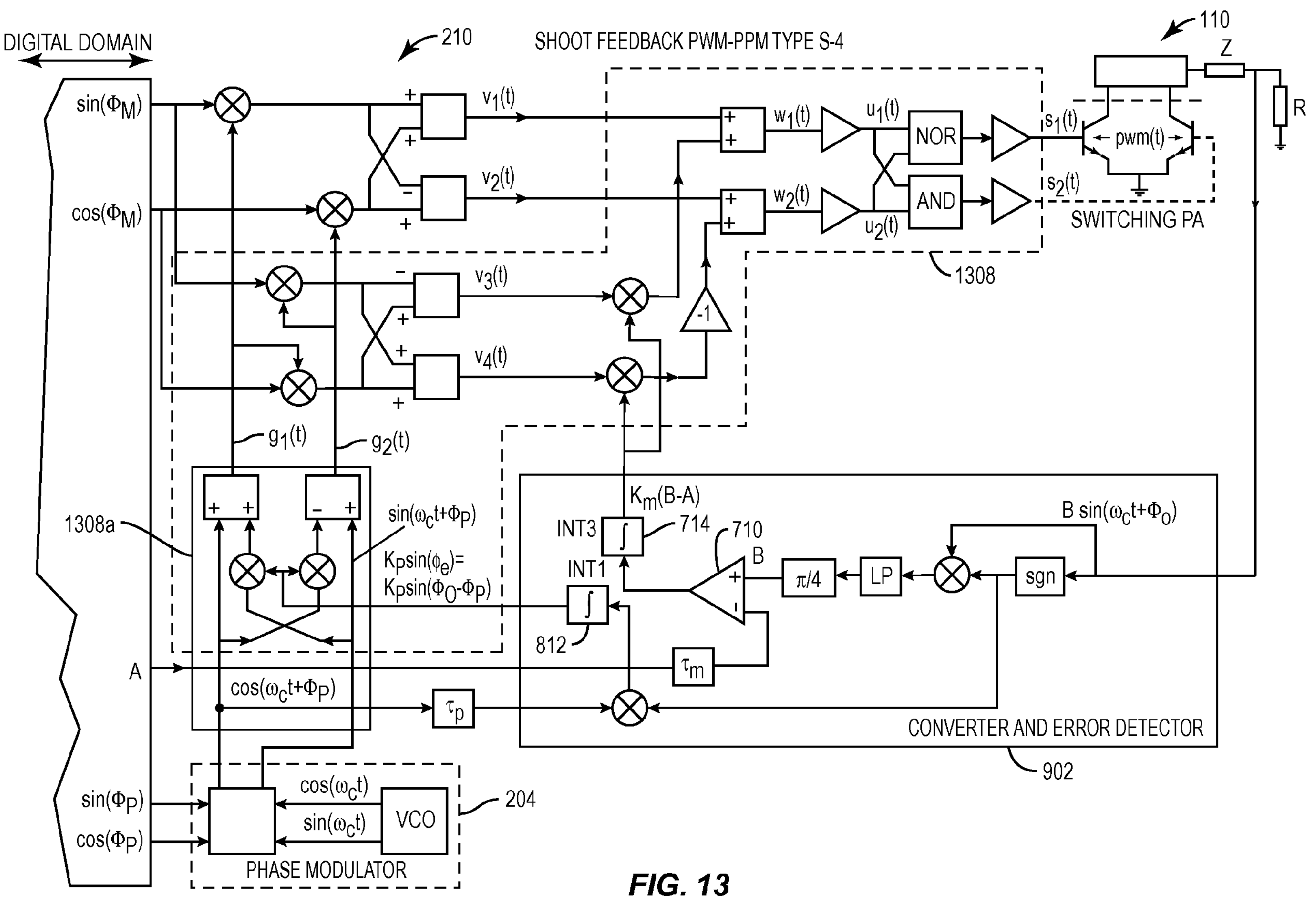
FIG. 13 a seventh embodiment of the apparatus according to the invention and FIG. 14 a phase correction diagram relating to the embodiment according to FIG. 13.

FIG. 13 shows a seventh embodiment of the apparatus according to the invention. The apparatus again comprises the down converting and error detecting unit 902 as described above and second modulating unit 1308 (PWM-PPM-modulator). Further units, like up converting units 204, 210, are already known and hold the same reference signs. Second PWM-PPM modulating unit 1308 comprises six multiplying units, six addition units, an inverting unit and a NOR and an AND gate yielding the $S_1(t)$ and $S_2(t)$ signals which are fed to the amplifier unit 110 as explained above.

The apparatus according to FIG. 13 functions as follows:

The outgoing signals $\sin(\omega_C t+\Phi_P)$, $\mathrm{COS}(\omega_C t+\Phi_P)$ of up converting unit 204 are forwarded to phase correction subunit 1308*a* of second modulating unit 1308 and are then multiplied with the phase error signal $$INT1(t)=K_p\sin(\phi_e).$$

The resulting signals are forwarded to the adders arranged within the phase correction subunit 1308*a*. This yields the following signals $$g_1(t)=\cos(\omega_C t+\Phi_P(t))+K_P\sin(\phi_e)\sin(\omega_C t+\Phi_P(t)),$$

$$g_2(t)=\sin(\omega_C t+\Phi_P(t))-K_P\sin(\phi_e)\cos(\omega_C t+\Phi_P(t)).$$

Figure 14:
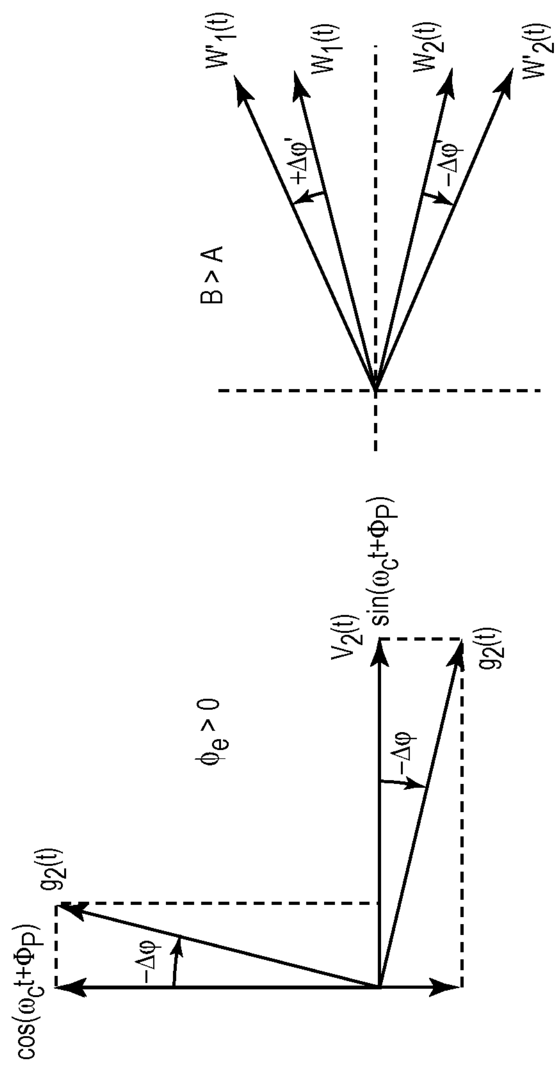

This is shown in FIG. 14 (left side) for the case of an unwanted increase of the output phase $\Phi_O$. This increase results in a positive increase of the error signal $$INT1(t)=K_p\sin(\phi_e).$$

In turn, this causes a negative rotation of the signals $g_1(t)$ and $g_2(t)$. Thus, the phase error detection can be performed independently from the RF frequency, which is an advantage.

Pulse width control is obtained by an equal positive and negative phase shift of the signals $v_1(t)$ and $v_2(t)$. This method, which is already shown in the architecture of FIG. 11, generates the wanted phases of $w_1(t)$ and $w_2(t)$ by adding successively subtracting equal weighted values of the signals $v_3(t)$ and $v_4(t)$ to the signals $v_1(t)$ and $v_2(t)$.

$$w_1'(t)=v_1(t)+K_m(B(t)-A(t-\tau_m))v_3(t)$$

$$w_2'(t)=v_2(t)-K_m(B(t)-A(t-\tau_m))v_4(t)$$

The change in phase of the signals $w_1(t)$ and $w_2(t)$ is given by the signals $w'_1(t)$ and $w'_2(t)$ and is visualized by the right part of FIG. 14. The Fig. indicates that the duty cycle will decrease for B>A, which is the correct feedback polarity.

This architecture has the advantage that the phase error correction is independent on the RF frequency, this in contrast to architecture of FIG. 11. Another advantage is the shorter feedback loop which is responsible to correct the pulse width.

The application has been described above by means of exemplary embodiments. It should be noted that there are alternative ways and variations which are obvious to a skilled person in the art and can be implemented without deviating from the scope and spirit of the appended claims.

Furthermore, it is readily clear for a skilled person that the logical blocks in the schematic block diagrams presented in the above description may at least partially be implemented in electronic hardware and/or computer software, wherein it depends on the functionality of the logical block and algorithm step and on design constraints imposed on the respective devices to which degree a logical block or algorithm step is implemented in hardware or software. The presented logical blocks and algorithm steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

The invention claimed is:

1. An apparatus comprising:

a signal generator configured to generate a signal having an amplitude component and a phase component;

a first pulse position modulating unit configured to modulate the phase component of the generated signal;

a first pulse width modulating unit configured to modulate the amplitude component of the generated signal onto the phase modulated signal;

an amplifier unit configured to amplify the amplitude and phase modulated signal;

a feedback loop path configured to correct the amplitude and phase modulated signal using an error signal; and a second pulse width modulating unit configured to modulate the error signal onto the amplitude and phase modulated signal.

2. The apparatus according to claim 1, wherein the signal generator is configured to generate a polar signal.

3. The apparatus according to claim 1, wherein the amplifying unit is a switching power amplifier.

4. The apparatus according to claim 1, wherein the apparatus comprises a predistortion unit configured to predistort the generated signal.

5. The apparatus according to claim 1, wherein the feedback loop path comprises a second pulse position modulating unit configured to modulate an error signal onto the amplitude and phase modulated signal.

6. The apparatus according to claim 1, wherein the first pulse position modulating unit comprises a first mapping unit configured to map the phase component to at least one suitable function according to a chosen implementation of the first pulse position modulating unit.

7. The apparatus according to claim 1, wherein the first pulse position modulating unit comprises a first up converting unit.

8. The apparatus according to claim 1, wherein the first pulse width modulating unit and the first pulse position modulating unit are arranged as one pulse width pulse position modulating unit.

9. The apparatus according to claim 4, wherein the predistortion unit is configured to determine a phase shift function depending on the generated signal.

10. The apparatus according to claim 4, wherein the predistortion unit comprises a first determining unit configured to determine a duty cycle function depending on the generated signal.

11. The apparatus according to claim 5, wherein the second pulse width modulating unit and the second pulse position modulating unit are arranged as one pulse width pulse position modulating unit.

12. The apparatus according to claim 6, wherein the first pulse width modulating unit comprises a second mapping unit configured to map the phase shift function to at least one suitable function according to a chosen implementation of the first pulse width modulating unit.

13. The apparatus according to claim 7, wherein the first pulse width modulating unit comprises a second up converting unit.

14. The apparatus according to claim 8, wherein the feedback loop path comprises a down converting and error detecting unit.

15. The apparatus according to claim 10, wherein the predistortion unit comprises a second determining unit configured to determine the phase shift function depending on the determined duty cycle function.

16. A method comprising:

generating a signal having an amplitude component and a phase component;

modulating the phase component of the generated signal using pulse position modulation;

modulating the amplitude component of the generated signal onto the phase modulated signal using pulse width modulation;

amplifying the amplitude and phase modulated signal;

generating an error signal in a feedback loop path; and modulating the error signal onto the amplitude and phase modulated signal using pulse width modulation.

17. A non-transitory computer readable medium having a computer program stored thereon, the computer program comprising instructions operable to cause a processor to perform the method steps of:

generating a signal having an amplitude component and a phase component;

modulating the phase component of the generated signal using pulse position modulation;

modulating the amplitude component of the generated signal onto the phase modulated signal using pulse width modulation;

amplifying the amplitude and phase modulated signal;

generating an error signal in a feedback loop path; and modulating the error signal onto the amplitude and phase modulated signal.

18. A transmitter comprising an apparatus comprising:

a signal generator configured to generate a signal having an amplitude component and a phase component;

a first pulse position modulating unit configured to modulate the phase component of the generated signal;

a first pulse width modulating unit configured to modulate the amplitude component of the generated signal onto the phase modulated signal;

an amplifier unit configured to amplify the amplitude and phase modulated signal;

a feedback loop path configured to correct the amplitude and phase modulated signal using an error signal; and a second pulse width modulating unit configured to modulate the error signal onto the amplitude and phase modulated signal.

* * * * *